US011319508B2

(12) United States Patent
Im et al.

(10) Patent No.: US 11,319,508 B2
(45) Date of Patent: May 3, 2022

(54) CLEANING COMPOSITION FOR REMOVING OXIDE AND METHOD OF CLEANING USING THE CLEANING COMPOSITION

(71) Applicant: Samsung Display Co., Ltd., Yongin (KR)

(72) Inventors: Sungsoon Im, Yongin (KR); Kyuhwan Hwang, Yongin (KR); Inho Kong, Cheonan-si (KR); Changsub Kim, Cheonan-si (KR); Hotae Kim, Asan-si (KR); Jaehwan Jin, Gumi-si (KR); Donguk Hwang, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/808,128

(22) Filed: Jul. 24, 2015

(65) Prior Publication Data
US 2016/0186100 A1    Jun. 30, 2016

(30) Foreign Application Priority Data

Dec. 24, 2014   (KR) .................. 10-2014-0188649

(51) Int. Cl.
| | | |
|---|---|---|
| *C11D 3/20* | (2006.01) | |
| *C11D 3/04* | (2006.01) | |
| *C11D 11/00* | (2006.01) | |

(52) U.S. Cl.
CPC ............ *C11D 3/2086* (2013.01); *C11D 3/042* (2013.01); *C11D 3/046* (2013.01); *C11D 3/2075* (2013.01); *C11D 11/0047* (2013.01)

(58) Field of Classification Search
CPC . C11D 3/2086; C11D 11/0047; C11D 3/2075; C11D 3/042; C11D 3/046;
(Continued)

(56) References Cited

U.S. PATENT DOCUMENTS 1,988,823 A * 1/1935 Winning .............. C11D 3/0073
510/258
3,510,432 A * 5/1970 Squire ...................... C11D 7/16
510/269
(Continued)

FOREIGN PATENT DOCUMENTS

| CN | 1399792 | 2/2003 |
|---|---|---|
| CN | 1469794 | 1/2004 |

(Continued)

OTHER PUBLICATIONS

JP 04329884 A , Computer Translation via Patentscope. (Year: 2021).*

(Continued)

*Primary Examiner* — Nadine G Norton
*Assistant Examiner* — Christopher Remavege
(74) *Attorney, Agent, or Firm* — H.C. Park & Associates, PLC

(57) ABSTRACT

The present disclosure relates to a cleaning composition for removing an oxide including an acid selected from an organic acid, an inorganic acid, and a combination thereof; a salt selected from an organic salt, an inorganic salt, and a combination thereof; a surfactant; and water, and a method of cleaning using the cleaning composition.

13 Claims, 3 Drawing Sheets

(58) Field of Classification Search
CPC ....... H01L 21/30604; H01L 31/022425; H01L 21/32134; H01L 21/707; H01L 27/1225; H01L 27/1262; H01L 29/66969; H01L 29/7869; H01L 21/31133; H01L 2924/14; H01L 31/1884; H01L 31/1888
USPC .......... 216/252, 79.1–79.5, 96.99; 134/4, 26, 134/28, 29; 252/79.1–79.5
See application file for complete search history.

(56) References Cited

U.S. PATENT DOCUMENTS

| | | | | |
|---|---|---|---|---|
| 3,650,964 | A * | 3/1972 | Sedliar et al. | C11D 3/2075 510/383 |
| 4,895,617 | A * | 1/1990 | Roche | C09K 13/06 216/103 |
| 5,108,642 | A * | 4/1992 | Aszman | A47L 13/17 510/199 |
| 5,215,676 | A * | 6/1993 | Stone | C11D 7/08 252/574 |
| 5,269,957 | A * | 12/1993 | Ikeda | C11D 1/72 252/389.2 |
| 5,525,252 | A * | 6/1996 | Levin | C02F 5/08 510/108 |
| 5,545,354 | A * | 8/1996 | Ofosu-Asante | C11D 1/652 510/237 |
| 5,607,911 | A * | 3/1997 | Levin | C02F 5/08 252/175 |
| 5,653,917 | A * | 8/1997 | Singerman | C02F 5/10 134/3 |
| 6,110,886 | A * | 8/2000 | Scepanski | C11D 1/835 510/287 |
| 6,361,712 | B1 * | 3/2002 | Honda | C11D 7/08 216/101 |
| 6,623,355 | B2 | 9/2003 | McClain et al. | |
| 6,669,857 | B2 | 12/2003 | Hintermaier | |
| 6,696,399 | B1 * | 2/2004 | Chernin | C11D 1/83 510/241 |
| 6,773,873 | B2 * | 8/2004 | Seijo | C11D 7/265 134/2 |
| 7,329,365 | B2 | 2/2008 | Cho et al. | |
| 7,399,366 | B1 * | 7/2008 | Wegner | C23F 14/02 134/10 |
| 7,410,902 | B2 * | 8/2008 | Tamura | C11D 3/042 134/3 |
| 7,642,227 | B2 * | 1/2010 | Kurtz | C11D 3/044 510/424 |
| 7,851,430 | B2 * | 12/2010 | Kurtz | C11D 1/146 510/382 |
| 7,947,638 | B2 * | 5/2011 | Tamura | C11D 3/2082 510/175 |
| 8,168,544 | B2 * | 5/2012 | Chang | C09K 13/04 216/101 |
| 8,262,928 | B2 * | 9/2012 | Kim | H01L 21/32134 252/79.3 |
| 8,557,711 | B2 * | 10/2013 | Fujikawa | C23F 1/20 438/754 |
| 8,864,915 | B2 * | 10/2014 | Jia | B08B 3/08 134/1 |
| 9,831,088 | B2 | 11/2017 | Chen et al. | |
| 2002/0055323 | A1 * | 5/2002 | McClain | B24B 37/042 451/41 |
| 2003/0207561 | A1 * | 11/2003 | Dubin | H01L 21/288 438/630 |
| 2003/0234184 | A1 * | 12/2003 | Liu | B23H 3/08 205/680 |
| 2004/0061092 | A1 * | 4/2004 | Brankovic | C09K 13/00 252/79.1 |
| 2004/0137736 | A1 * | 7/2004 | Daviot | C11D 11/0047 438/690 |
| 2004/0242449 | A1 * | 12/2004 | Joshi | C23G 1/125 510/372 |
| 2005/0143271 | A1 * | 6/2005 | Tamura | C11D 11/0047 510/175 |
| 2006/0040838 | A1 * | 2/2006 | Shimada | C11D 3/042 510/175 |
| 2006/0043332 | A1 * | 3/2006 | Cho | C09K 13/06 252/79.4 |
| 2006/0122083 | A1 * | 6/2006 | Tamura | C11D 7/268 510/175 |
| 2007/0203041 | A1 * | 8/2007 | Lee | C11D 7/08 510/175 |
| 2007/0237733 | A1 * | 10/2007 | Simonet | A61K 8/06 424/70.12 |
| 2008/0041823 | A1 * | 2/2008 | La | C03C 15/00 216/97 |
| 2009/0124091 | A1 * | 5/2009 | Fujikawa | C23F 1/20 438/754 |
| 2009/0227075 | A1 * | 9/2009 | Kim | C09K 13/06 438/151 |
| 2009/0233835 | A1 * | 9/2009 | Cermenati | C11D 3/2075 510/238 |
| 2010/0112728 | A1 * | 5/2010 | Korzenski | H01L 21/02079 438/3 |
| 2011/0005001 | A1 * | 1/2011 | Robles | C11D 1/37 8/137 |
| 2011/0140181 | A1 * | 6/2011 | Afzali-Ardakani | G03F 7/423 257/288 |
| 2011/0245127 | A1 * | 10/2011 | Suzuki | C11D 1/008 510/163 |
| 2012/0208310 | A1 * | 8/2012 | Kim | H01L 51/0023 438/34 |
| 2013/0216700 | A1 * | 8/2013 | Morioka | H01M 4/8605 427/115 |
| 2013/0292800 | A1 * | 11/2013 | Cao | H01L 21/02568 257/613 |
| 2014/0038420 | A1 * | 2/2014 | Chen | H01L 21/32134 438/754 |
| 2014/0174467 | A1 * | 6/2014 | Larson, III | C11D 3/2086 134/6 |
| 2014/0186996 | A1 * | 7/2014 | Takeuchi | H01L 21/465 438/104 |
| 2015/0140704 | A1 * | 5/2015 | Choung | H01L 21/02052 438/28 |
| 2015/0344738 | A1 * | 12/2015 | Onishi | C09G 1/02 438/692 |
| 2016/0177457 | A1 * | 6/2016 | Yokomizo | C23F 1/38 438/754 |

FOREIGN PATENT DOCUMENTS

| | | | |
|---|---|---|---|
| CN | 1749354 | 4/2011 | |
| CN | 103286091 | 9/2013 | |
| CN | 103154321 | 11/2015 | |
| JP | 04329884 A | * 11/1992 | ............ C23C 22/52 |
| JP | 3829240 | 10/2006 | |
| KR | 101250777 B1 | 4/2013 | |

OTHER PUBLICATIONS

Office Action dated Dec. 25, 2018, in Chinese Patent Application No. 201510982861.9.

* cited by examiner

CLEANING COMPOSITION FOR REMOVING OXIDE AND METHOD OF CLEANING USING THE CLEANING COMPOSITION

CLAIM PRIORITY

This application makes reference to, incorporates into this specification the entire contents of, and claims all benefits accruing under 35 U.S.C. § 119 from an application CLEANING COMPOSITION FOR REMOVING OXIDE AND METHOD OF CLEANING USING THE CLEANING COMPOSITION earlier filed in the Korean Intellectual Property Office on Dec. 24, 2014 and there duly assigned serial No. 10-2014-0188649.

BACKGROUND OF THE INVENTION

Field of the Invention

The present invention relates to a cleaning composition for removing an oxide and a method of cleaning using the cleaning composition.

Description of the Related Art

Organic light-emitting devices (OLEDs) are self-emission devices that have wide viewing angles, high contrast ratios, and short response times. In addition, the OLEDs exhibit excellent luminance, driving voltage, and response speed characteristics, and produce full-color images.

The OLEDs may have a stacked structure of a first electrode, an organic layer, and a second electrode on a substrate in the stated order. The stacked structure of OLEDs may be formed by using a vacuum-deposition method using a mask. In other words, the organic layer may be fine-patterned by using a vacuum-deposition method using a metal mask, for example, a fine metal mask (FMM). However, the first electrode and second electrode may be formed by using a vacuum-deposition using an open mask, since the first electrode and second electrode are not to be fine-patterned.

In general, the FMM may be formed by processing a mask base material by using a wet etching process or lasering process. A mask may introduce contamination materials during vacuum-deposition process, and therefore, it is required to clean the mask. During the wet etching process, impurities may be removed by rinsing the mask base material with a conventional cleaning solution, such as distilled water or alcohol.

However, when processing a mask base material by using a lasering process, an oxide, which is naturally formed when irradiating the mask base material with a laser, is not removed with the conventional cleaning solution. Thus, there remains a problem that the oxide remains on the mask base material.

SUMMARY OF THE INVENTION

One or more exemplary embodiments may include a cleaning composition for removing an oxide, which selectively removes oxides formed on a surface of a mask base material, while not damaging the mask base material.

One or more exemplary embodiments may include a method of cleaning by using the cleaning composition for removing an oxide.

Additional aspects will be set forth in part in the description which follows and, in part, will be apparent from the description, or may be learned by practice of the presented embodiments.

According to one or more exemplary embodiments of the present invention, a cleaning composition for removing an oxide, may include an acid selected from an organic acid, an inorganic acid, and a combination thereof; a salt selected from an organic salt, an inorganic salt, and a combination thereof; a surfactant; and water.

According to one or more exemplary embodiments of the present invention, a method of cleaning may include preparing a mask base material comprising an oxide; and performing a first cleaning by contacting the cleaning composition of any one of claims 1 to 11 with the mask base material.

BRIEF DESCRIPTION OF THE DRAWINGS

A more complete appreciation of the present invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
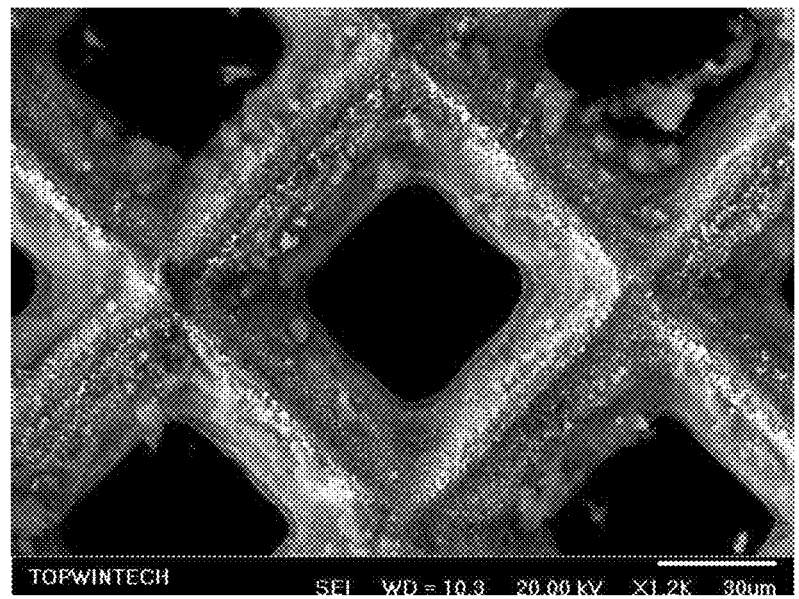
FIG. 1 is a scanning electron microscope (SEM) image showing a surface of an Invar stick regarding Preparation Example 3 according to an exemplary embodiment of the present invention.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, a cleaning composition for removing an oxide and method of cleaning using the cleaning composition according to exemplary embodiments will be explained in detail with reference to the attached drawings. However, the inventive concept is not limited to thereto, and all differences within the scope will be construed as being included in the inventive concept.

It will be understood that although the terms "first," "second," etc. may be used herein to describe various components, these components should not be limited by these terms. These components are only used to distinguish one component from another.

In the present specification, it is to be understood that the terms such as "including," "having," and "comprising" are intended to indicate the existence of the features or components disclosed in the specification, and are not intended to preclude the possibility that one or more other features or components may exist or may be added.

As used herein, the term an "organic acid" indicates an organic compound that is acidic (i.e., has a pH lower than 7) in an aqueous environment, for example, an organic compound including an acid functional group, such as a carboxyl group (—COOH), a sulfonic acid group (—SO$_3$H), an aryl group substituted with a hydroxy group (—ArOH) (wherein, Ar indicates an aryl group, such as a phenyl group), or a mercapto group (—SH).

As used herein, the term an "inorganic acid" indicates a compound that is acidic (i.e., has a pH lower than 7) in an aqueous environment, wherein an acid group containing a non-metal element, such as chlorine, nitrogen, sulfur, or phosphorus is not bound to a carbon atom, but is bound to a hydrogen.

Hereinafter, a cleaning composition for removing an oxide and method of cleaning using the cleaning composition according to an exemplary embodiment of the present invention will be explained in detail.

According to an exemplary embodiment of the present invention, a cleaning composition for removing an oxide may include an acid selected from an organic acid, an inorganic acid, and a combination thereof; a salt selected from an organic salt, an inorganic salt, and a combination thereof; a surfactant; and water.

The acid in the cleaning composition for removing an oxide may react with an oxide described below, thereby providing removing the oxide.

The acid may be used in a sufficient amount to selectively remove an oxide. For example, an amount of the acid may be in a range of about 0.1 wt % to about 50 wt % based on 100 wt % of the cleaning composition for removing an oxide. In some embodiments, an amount of the acid may be, based on 100 wt % of the cleaning composition for removing an oxide, in a range of about 0.1 wt % to about 40 wt %, in some embodiments, about 0.1 wt % to about 35 wt %, in some embodiments, about 0.1 wt % to about 30 wt %, and in some embodiments, about 0.1 wt % to about 25 wt %. When the amount of the acid is within these ranges, the cleaning composition for removing an oxide may have an excellent cleaning ability, while not damaging a base material.

According to an embodiment of the present invention, the acid may be an organic acid. For example, the organic acid may include a carboxylic acid having a carboxyl group (—COOH). In particular, the organic acid may be a carboxylic acid having at least one carboxyl group and 2 to 10 carbon atoms, but embodiments are not limited thereto.

According to an embodiment of the present invention, for example, the organic acid may include at least one carboxylic acid selected from an acetic acid, a formic acid, a propionic acid, a butyric acid, an isobutyric acid, a valeric acid, an ethylmethyl acetic acid, a trimethyl acetic acid, a succinic acid, an adipic acid, a citric acid, an oxalic acid, a lactic acid, a tartaric acid, a malic acid, an ascorbic acid, and a malonic acid.

Further, the organic acid may include a sulfonic acid having a sulfonic acid group (—SO$_3$H). For example, the organic acid may include at least one sulfonic acid selected from a methane sulfonic acid, an ethane sulfonic acid, an n-propane sulfonic acid, an iso-propane sulfonic acid, and an n-butane sulfonic acid.

The organic acid may be used alone or in a combination of at least two thereof.

In some embodiments of the present invention, the acid may be an inorganic acid.

The inorganic acid may include at least one acid selected from a sulfuric acid, a hydrochloric acid, a phosphoric acid, a nitric acid, and a perchloric acid, but embodiments are not limited thereto.

The inorganic acid may be used alone or in a combination of at least two thereof.

The salt in the cleaning composition for removing an oxide may enhance the ability of the cleaning composition to remove the oxide.

In some embodiments of the present invention, for example, the salt may include at least one salt selected from an inorganic salt including at least one of a sulfate, a phosphate, a hydrochloride, and a nitrate and an organic salt including at least one of carboxylate and sulfonate.

Particularly, the salt may include inorganic salt including at least one of a sodium sulfate, a potassium sulfate, a magnesium sulfate, and an ammonium sulfate.

In some embodiments of the present invention, the salt may include an organic salt including at least one of a sodium acetate, a potassium acetate, a sodium citrate, and a potassium citrate.

In some embodiments of the present invention, for example, an amount of the salt may be in a range of about 0.1 wt % to about 35 wt %, based on 100 wt % of the cleaning composition for removing an oxide. In some embodiments, an amount of the salt may be, based on 100 wt % of the cleaning composition for removing an oxide, in a range of about 0.1 wt % to about 30 wt %, in some embodiments, about 0.1 wt % to about 25 wt %, in some embodiments, about 0.1 wt % to about 20 wt %, and in some embodiments, about 0.1 wt % to about 15 wt %. When the amount of the salt is within these ranges, the cleaning composition for removing an oxide may have an excellent cleaning ability, while not damaging a base material.

Due to the surfactant present in the cleaning composition used for removing an oxide, an oxide that has been removed from a surface of a mask base material may be prevented from reattaching to the same.

The surfactant may include at least one surfactant selected from an anionic surfactant including at least one of an alkyl sulfate, an alkyl ether sulfate, an alkyl sulfonate, an alkyl ether sulfonate, an alkyl phosphate, an alkyl ether phosphate, an alkyl carbonate, and an alkyl ether carbonate, and a nonionic surfactant including at least one of a polyoxyethylene alkyl ether, a polyoxyethylene fatty acid ester, a polyoxyethylene alkyl phenol ether, a sorbitan fatty acid ester, a polyoxyethylene sorbitan fatty acid ester, and a sucrose fatty acid ester.

In some embodiments of the present invention, for example, the nonionic surfactant may include at least one nonionic surfactant selected from a lauryl sulfonate, an isotridecyl sulfonate, a naphthalene sulfonate, a dibutyl naphthyl sulfonate, a nonyl benzene sulfonate, a dodecyl benzene sulfonate, an isotridecyl benzene sulfonate, a lauryl sulfate, an isotridecyl sulfate, and a stearyl sulfate, but embodiments are not limited thereto.

The nonionic surfactant may not be dissociated into ions in an aqueous solution, but be dissolved. The nonionic surfactant may be a polymer which a hydrophobic monomer and a hydrophilic monomer are polymerized.

The nonionic surfactant lowers the surface tension of water, so that the surface on which an oxide forms may be easily wet. The nonionic surfactant also lowers a binding strength between a surface and an oxide, so that the oxide may be easily removed from the surface. The oxide removed from the surface may be surrounded by surfactant molecules, and thus, the surfactant molecules may be easily dispersed in a cleaning solution to enhance the ability of the cleaning composition to remove the oxide.

In some embodiments of the present invention, for example, an amount of the surfactant may be in a range of about 0.1 wt % to about 15 wt %, based on 100 wt % of the cleaning composition for removing an oxide. In some embodiments, an amount of the surfactant may be, based on 100 wt % of the cleaning composition for removing an oxide, in a range of about 0.1 wt % to about 10 wt %, in some embodiments, about 0.1 wt % to about 5 wt %, and in some embodiments, about 0.1 wt % to about 3 wt %. When the amount of the salt is within these ranges, the cleaning composition for removing an oxide may have an excellent cleaning ability, while preventing the oxide that has been removed from the surface of the base material from reattaching to the same.

The cleaning composition for removing an oxide may include water as well as above-described components, with respect to 100 wt % of the cleaning composition for removing an oxide. The water may be deionized water or ultrapure water having substantially decreased level of impurities.

The cleaning composition may be capable of reducing at least one oxide of a metal selected from iron (Fe), cobalt (Co), chromium (Cr), manganese (Mn), nickel (Ni), titanium (Ti), molybdenum (Mo), a steel use stainless (SUS) alloy, an Inconel alloy, a Kovar alloy, and an Invar alloy.

For example, among the above described metals, an oxide of Fe, Ni, or Co may be, although not limited thereto, reduced according to the following Equation 1:

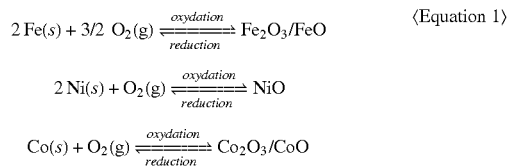

$$2\,Fe(s) + 3/2\,O_2(g) \underset{reduction}{\overset{oxydation}{\rightleftharpoons}} Fe_2O_3/FeO \quad \langle\text{Equation 1}\rangle$$

$$2\,Ni(s) + O_2(g) \underset{reduction}{\overset{oxydation}{\rightleftharpoons}} NiO$$

$$Co(s) + O_2(g) \underset{reduction}{\overset{oxydation}{\rightleftharpoons}} Co_2O_3/CoO$$

The cleaning composition for removing an oxide according to an embodiment of the present invention may include the acid, the salt, and the surfactant, and thus, the cleaning composition may induce reduction reaction of the oxide and control a reaction rate with the oxide. As a result, the oxide may be selectively removed. In addition, the cleaning composition for removing an oxide may prevent an oxide, which remains in the cleaning composition after the cleaning, from reattaching to a surface.

The cleaning composition for removing an oxide may be prepared by using a known method.

According to an embodiment of the present invention, for example, the cleaning composition for removing an oxide may be prepared by mixing the acid, the salt, the surfactant, and water such that a total weight of the components is 100 wt %. In addition, the cleaning composition for removing an oxide may include other components within a range that does not affect adversely. The above-described components may be mixed with in a random order provided that they do not cause a particular problem, such as an undesired reaction or forming of a precipitate. Any two of the components may be pre-mixed together, and the other components may be added to the mixture thereafter. Alternatively, all of the components may be mixed together at the same time.

Hereinafter, a method of cleaning according to an exemplary embodiment of the present invention will be described in detail.

The method of cleaning may include preparing a mask base material having an oxide; and performing a first cleaning by contacting the cleaning composition for removing the oxide with the mask base material.

The mask base material may include at least one metal selected from Fe, Co, Cr, Mn, Ni, Ti, Mo, an SUS alloy, an Inconel alloy, a Kovar alloy, and an Invar alloy, but embodiments are not limited thereto.

According to an embodiment of the present invention, for example, the mask base material may be an Invar alloy. Principal components of the Invar alloy are Fe and Ni, and the Invar alloy is advantageous in that the Invar alloy has less thermal expansion compared to the SUS alloy, and its tension does not decrease in a substantial degree even at a high temperature.

The mask base material may be processed by a laser irradiation.

According to an embodiment of the present invention, for example, the mask base material may be processed by a laser irradiation with an energy density in a range of about 50 mJ/cm$^2$ to about 5,000 mJ/cm$^2$. In particular, the mask base material may be processed by a laser irradiation with energy density in a range of about 200 mJ/cm$^2$ to about 1,000 mJ/cm$^2$.

In addition, the mask base material may be processed by a laser irradiation for about 1 minute to about 1,440 minutes. For example, the mask base material may be processed by a laser irradiation for about 60 minutes to about 720 minutes.

The oxide may be naturally formed when irradiating the mask base material with a laser.

For example, the oxide may be an oxide of a metal selected from Fe, Co, Cr, Mn, Ni, Ti, Mo, an SUS alloy, an Inconel alloy, a Kovar alloy, and an Invar alloy, wherein the oxide of the metal is naturally formed on the mask base material when the mask base material is irradiated with a laser.

For example, the oxide may be an oxide of an Invar alloy, but embodiments are not limited thereto.

For example, the mask base material may include an Invar alloy and an oxide of an Invar alloy, but embodiments are not limited thereto.

The cleaning composition for removing an oxide may be understood by referring to the detailed description provided herein.

In the first cleaning, the oxide may be removed by contacting the cleaning composition for removing an oxide with the mask base material to reduce the oxide and separate the reduced oxide from the mask base material.

The first cleaning, although not limited thereto, may be performed by contacting the cleaning composition for removing an oxide with the mask base material by using a spray method that includes spraying the cleaning composition for removing an oxide on the mask material, a spin coating method that includes high speed rotating the mask base material after contacting the cleaning composition with the mask base material, or a dipping method that includes immersing the mask base material into a cleaning bath filled with the cleaning composition for removing an oxide.

For example, the first cleaning may be performed by using a dipping method in a temperature range of about 10° C. to about 50° C. for about 60 minutes to about 1,440 minutes.

When the first cleaning is performed within these temperature and time ranges, a cleaning ability to remove an oxide may be improved, and damage to the mask base material may be minimized.

In some embodiments, the method of cleaning may further include at least one of a second cleaning using a cleaning mixture including a first alcohol, a surfactant, and water; a third cleaning using distilled water; and a fourth cleaning using a second alcohol.

For example, the method of cleaning may include performing the first cleaning, followed by performing the second cleaning, third cleaning, and fourth cleaning consecutively.

For example, the method of cleaning may include performing the first cleaning, followed by performing the third cleaning and fourth cleaning consecutively.

For example, the method of cleaning may include performing the first cleaning, followed by performing the second cleaning.

The second cleaning may prevent any oxides removed from the mask base material and remained in the cleaning composition during the first cleaning from re-attaching to the mask base material.

The second cleaning may be performed by using a described method, such as a spray method, a spin method, or a dipping method.

For example, the method of cleaning may include the second cleaning performed by using a dipping method in a temperature range of about 10° C. to about 50° C. for about 60 minutes to about 120 minutes.

In some embodiments, the cleaning mixture in the second cleaning, an amount of the first alcohol may be in a range of about 5 wt % to about 50 wt %, and an amount of the surfactant may be in a range of about 0.1 wt % to about 10 wt %, based on 100 wt % of the cleaning mixture in the second cleaning. For example, in the cleaning mixture in the second cleaning, an amount of the first alcohol may be in a range of about 5 wt % to about 25 wt %, and an amount of the surfactant may be in a range of about 0.1 wt % to about 5 wt %, based on 100 wt % of the cleaning mixture in the second cleaning. When the amount of each of the first alcohol and surfactant is within these ranges, a removed oxide may be prevented from being reattached.

When the method of cleaning further includes the second cleaning, a weight ratio of the cleaning mixture in the second cleaning to the cleaning composition for removing an oxide in the first cleaning may be in a range of about 1:1 to about 2:1, but embodiments are not limited thereto.

The surfactant included in the cleaning mixture in the second cleaning may include at least one surfactant selected from an anionic surfactant including at least one of an alkyl sulfate, an alkyl ether sulfate, an alkyl sulfonate, an alkyl ether sulfonate, an alkyl phosphate, an alkyl ether phosphate, an alkyl carbonate, and an alkyl ether carbonate and a nonionic surfactant including at least one of a polyoxyethylene alkyl ether, a polyoxyethylene fatty acid ester, a polyoxyethylene alkyl phenol ether, a sorbitan fatty acid ester, a polyoxyethylene sorbitan fatty acid ester, and a sucrose fatty acid ester.

For example, the surfactant included in the cleaning mixture in the second cleaning may include at least one nonionic surfactant selected from a lauryl sulfonate, an isotridecyl sulfonate, a naphthalene sulfonate, a dibutyl naphthyl sulfonate, a nonyl benzene sulfonate, a dodecyl benzene sulfonate, an isotridecyl benzene sulfonate, a lauryl sulfate, an isotridecyl sulfate, and a stearyl sulfate, but embodiments are not limited thereto.

The surfactant included in the cleaning mixture in the second cleaning may be identical to or different from the surfactant included in the cleaning composition for removing an oxide in the first cleaning.

The first alcohol and the second alcohol may include at least one selected from aliphatic hydrocarbon groups having at least one hydroxy group (—OH) and 1 to 10 carbon atoms.

For example, the first alcohol and the second alcohol may each independently include at least one alcohol selected from methanol, ethanol, pentanol, 2-methyl-2-butanol, 3-methyl-2-butanol, n-propanol, iso-propanol, butanol, iso-butyl alcohol, 2-butanol, 2-methyl-2-propanol, hexanol, cyclohexanol, benzyl alcohol, propyl alcohol, ethylene glycol, propylene glycol, diethylene glycol, glycerine, and dipropylene glycol.

The first alcohol and the second alcohol may be identical to or different from each other. For example, the first alcohol and the second alcohol may each be iso-propanol.

In some embodiments, the method of cleaning may include the third cleaning, and the third cleaning may be performed in a temperature range of about 10° C. to about 50° C. for about 1 minutes to about 60 minutes. When the third cleaning is performed within these temperature and time ranges, a cleaning ability to remove an oxide may substantially increase.

For example, the method of cleaning may include the third cleaning, and the third cleaning may be performed via ultrasonic cleaning of the mask base material at a frequency of 50 kHz or less by using distilled water.

When the method of cleaning includes the third cleaning, a weight ratio of the distilled water in the third cleaning to the cleaning composition for removing an oxide in the first cleaning may be in a range of about 1:1 to 2:1. When a weight ratio of the distilled water in the third cleaning to the cleaning composition for removing an oxide in the first cleaning is within this range, a cleaning ability to remove an oxide may substantially increase.

The method of cleaning may include the fourth cleaning, and the fourth cleaning may be performed in a temperature range of about 10° C. to about 50° C. for about 1 minutes to about 60 minutes. When the fourth cleaning is performed within these temperature and time ranges, a cleaning ability to remove an oxide may substantially increase.

When the method of cleaning includes the fourth cleaning, a weight ratio of the second alcohol in the fourth cleaning to the cleaning composition for removing an oxide in the first cleaning may be in a range of about 1:1 to 2:1. When a weight ratio of the second alcohol in the fourth cleaning to the cleaning composition for removing an oxide in the first cleaning is within this range, a cleaning ability to remove an oxide may substantially increase.

Hereinafter, the cleaning composition and the method of cleaning will be described in detail with reference to Examples. However, Examples are to describe the inventive concept in more detail, and thus, the scope of the inventive concept is not limited thereto.

EXAMPLE

Preparation Example 1

Preparation of a Cleaning Composition for Removing an Oxide (Preparation of a Cleaning Solution 1)

A cleaning solution 1 was prepared by mixing components listed in Table 1 according to a composition thereof.

Preparation Example 2

Preparation of a Cleaning Composition for Removing an Oxide (Preparation of a Cleaning Solution 2)

A cleaning solution 2 was prepared by mixing components listed in Table 1 according to a composition thereof.

TABLE 1

| | Acid | | Salt | | Surfactant | | |
|---|---|---|---|---|---|---|---|
| | Component | wt % | Component | wt % | Component | wt % | Water |
| Preparation Example 1 | Citric acid | 30% | Ammonium sulfate | 15% | Lauryl sulfonate | 1% | Remainder |
| Preparation Example 2 | Citric acid | 15% | Sodium citrate | 10% | Lauryl sulfonate | 1% | Remainder |

Preparation Example 3

Preparation of a Lasered Invar Stick

An Invar stick (width*length*thickness: 10 cm*10 cm*20 µm) was put on a stage in a laser patterned mask (LPM) system at room temperature and atmospheric pressure, a surface of the Invar stick was lasered by using a LPM optical system to thereby form square-like holes (wherein a width and length are each 40 µm). The processed Invar stick was examined by using a scanning electron microscope (SEM), and the result thereof is shown in FIG. 1.

Example 1

Cleaning the Invar Stick in Preparation Example 3 by Using Cleaning Solution 1

1,000 g of the cleaning solution 1 in Preparation Example 1 was poured in a cleaning bath (300 ml), and the Invar stick in Preparation Example 3 was immersed in the cleaning bath at a temperature about of 35° C. for about 240 minutes. Then, the Invar stick was taken out of the cleaning bath, and was immersed in 300 g of a mixture solution, in which iso-propyl alcohol, lauryl sulfonate, and distilled water are mixed in a weight ratio of 50:5:45 at a temperature of about 35° C. for about 60 minutes. Then, the Invar stick was taken out, and was dipped in a bath containing 300 g of distilled water for about 10 minutes. Next, the Invar stick was taken out, and was immersed in a cleaning bath containing 300 g of iso-propyl alcohol at a temperature of about 25° C. for about 10 minutes, thereby completing the cleaning of the Invar stick.

Example 2

Cleaning the Invar Stick in Preparation Example 3 by Using Cleaning Solution 2

The Invar stick in Preparation Example 3 was cleaned in the same manner as in Example 1, except that the cleaning solution 2 was used instead of the cleaning solution 1.

Evaluation Example 1

A surface composition ratio and a surface binder phase of an unprocessed Invar stick, the Invar stick according to Preparation Example 3, the Invar stick according to Example 1 after a period of 24 hours, and the Invar stick according to Example 1 after a period of 5 days were analyzed by using a X-ray photoelectron spectroscopy (XPS)(available from Thermo Fisher (UK), product name: Theta Probe), and the results thereof are shown in Table 2.

TABLE 2

| | Surface composition ratio (atom %) | | | Surface binder phase (atom %) | |
|---|---|---|---|---|---|
| | O1s | Fe2s | Ni2p | FeOx*/Fe | NiOx**/Ni |
| unprocessed Invar stick | 37.6 | 7.3 | 4.1 | 7.0 | 2.8 |
| Invar stick according to Preparation Example 3 | 44.0 | 11.5 | 2.5 | 14.6 | 4.8 |
| Invar stick according to Example 1 after a period of 24 hours | 34.1 | 12.4 | 5.7 | 2.4 | 2.4 |
| Invar stick according to Example 1 after a period of 5 days | 33.6 | 10.1 | 6.1 | 1.9 | 1.9 |

*FeOx indicates an oxide of Fe.
**NiOx indicates an oixde of Ni.

Referring to Table 2, the atomic percentage of O1s and the atomic percentages of FeOx and NiOx of the Invar stick in Preparation Example 3 were higher than those in the unprocessed Invar stick. Accordingly, it was verified that oxides were formed on the surface of the Invar stick due to the irradiating the mask base material with a laser.

On the other hand, when measured after a period of 24 hours and a period of 5 days after cleaning according to Example 1, the Invar stick had a decreased level of O1s composition and a decreased amount of binder phases of FeOx and NiOx compared to those of the Invar stick in Preparation Example 3. Therefore, it was confirmed that oxides were selectively removed from the Invar stick in Preparation Example 3 by performing the cleaning according to Example 1.

The Invar stick according to Example 1 was examined after a period of 24 hours and 5 days by using a SEM (available from: Seron Technologies, product name: AIS2100, energy beam: 20 kV, magnification: ×1.2 k), and the results thereof are shown in FIGS. 2A and 2B.

Figure 2A:
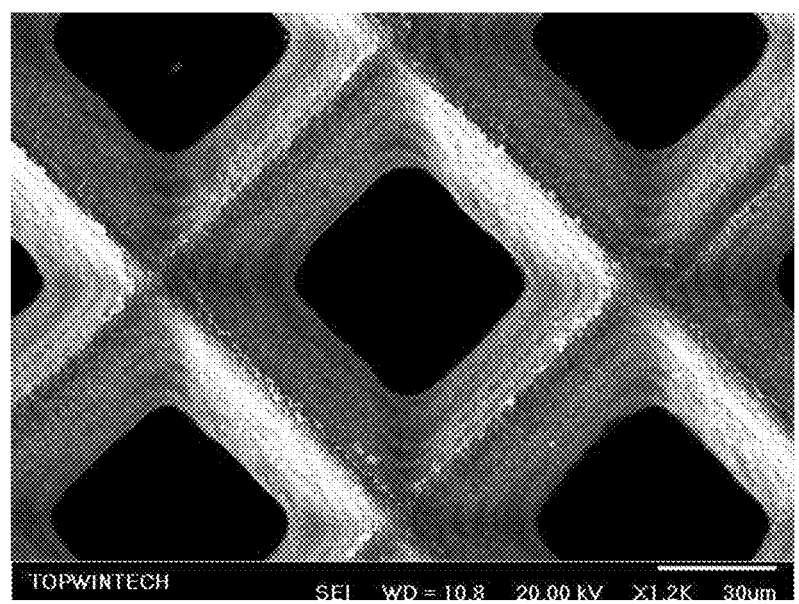
FIGS. 2A and 2B are each a SEM image showing a surface of an Invar stick regarding Example 1 after a period of 24 hours and 5 days, respectively, from the completion of the cleaning according to an exemplary embodiment of the present invention.
Figure 2B:
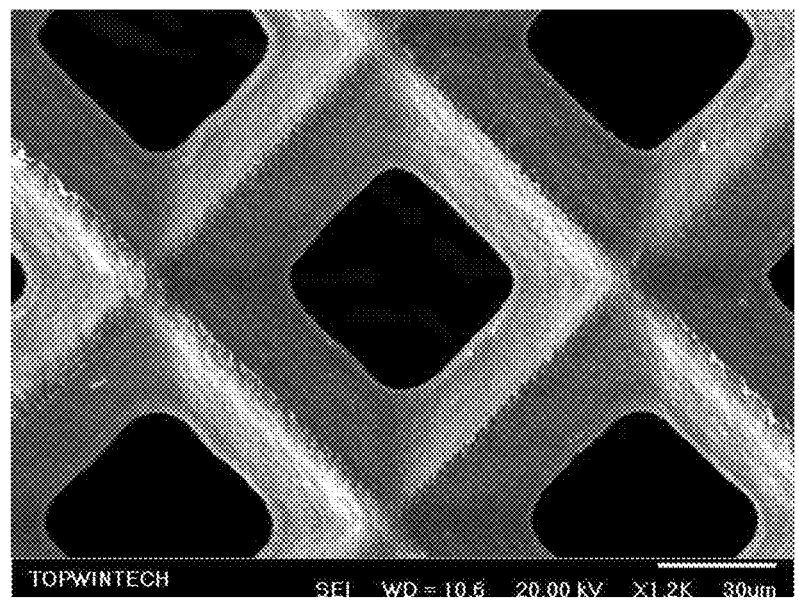

Referring to FIGS. 1, 2A, and 2B, the Invar stick according to Preparation Example 3 had formed oxides on its surface (refer to FIG. 1), however, oxides were selectively removed from a surface of the Invar stick according to Preparation Example 3 such that the surface of the Invar stick according to Example 1 was smooth (refer to FIGS. 2A and 2B). In addition, by comparing FIGS. 2A and 2B, it was verified that the Invar stick according to Example 1 was still oxide free even after a predetermined period of time.

Evaluation Example 2

Figure 3A:
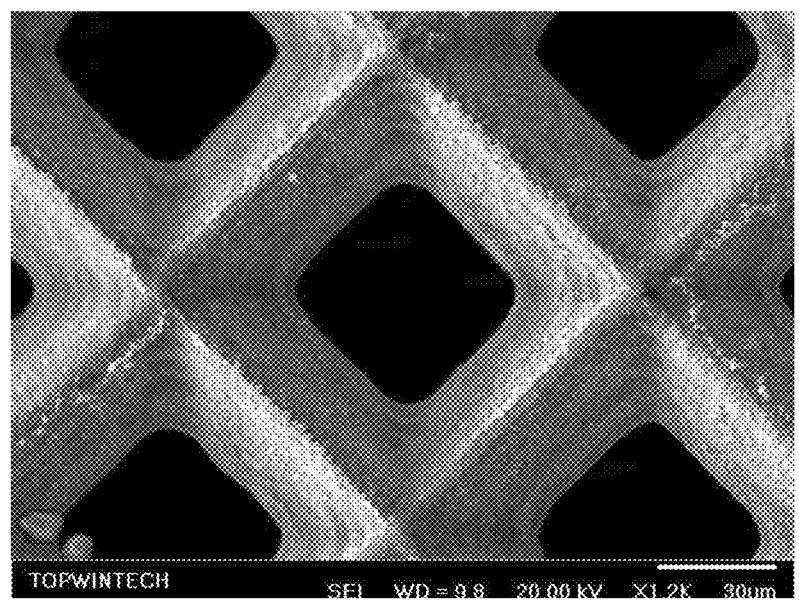
FIGS. 3A, 3B, and 3C are each a SEM image showing a surface of an Invar stick regarding Example 2 after a period of 1 hour, 4 hours, and 8 hours, respectively, from the completion of the cleaning according to an exemplary embodiment of the present invention.
Figure 3B:
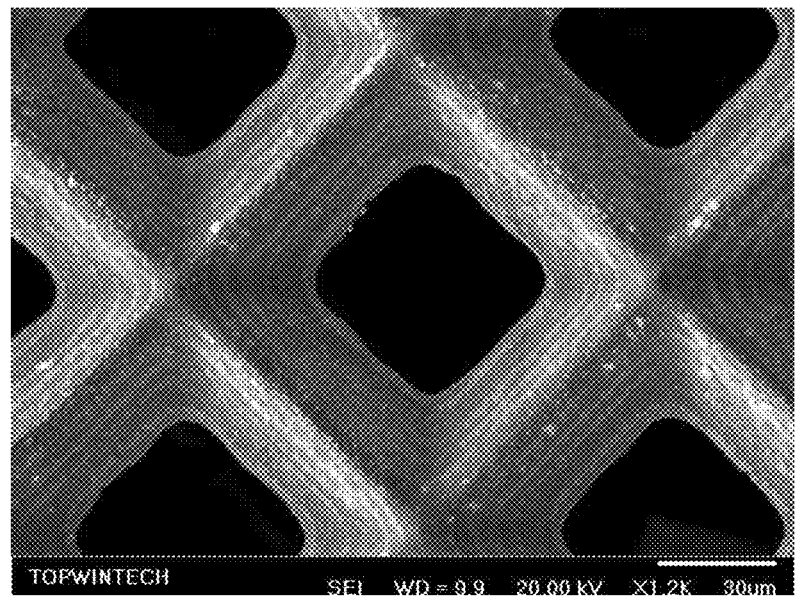
Figure 3C:
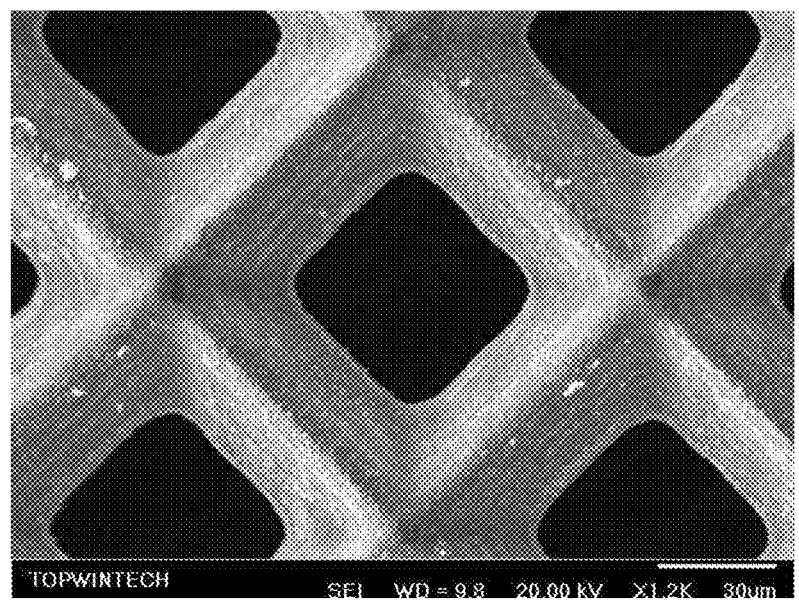

The Invar stick according to Example 2 was examined after a period of 1 hour, 4 hours, and 8 hours by using a SEM, and the results thereof are shown in FIGS. 3A, 3B, and 3C.

Referring to FIGS. 1, 3A, 3B, and 3C, the Invar stick according to Preparation Example 3 had formed oxides on its surface (refer to FIG. 1). However, oxides were selectively removed from a surface of the Invar stick in Preparation Example 3 such that the surface of the Invar stick in Example 2 was smooth (refer to FIGS. 3A, 3B, and 3C). In addition, by comparing FIGS. 3A, 3B, and 3C, it was verified that the Invar stick according to Example 2 was still free from oxides even after a predetermined period of time.

As described above, according to the one or more of the above exemplary embodiments, when using the cleaning composition for removing an oxide and method of cleaning using the cleaning composition for removing an oxide, an oxide formed on a surface of a mask base material may be selectively removed, while not damaging the mask base material.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A cleaning composition for removing an oxide, consisting of:
   citric acid;
   ammonium sulfate;
   a lauryl sulfonate; and
   a remainder is water,
   wherein, based on 100 wt % of the cleaning composition for removing the oxide, an amount of the citric acid is in a range of about 15 wt % to about 50 wt %, and
   wherein the cleaning composition is capable of reducing at least one oxide of a metal selected from iron (Fe), cobalt (Co), chromium (Cr), manganese (Mn), nickel (Ni), titanium (Ti), molybdenum (Mo), a steel use stainless (SUS) alloy, a nickel-chromium alloy, a nickel-cobalt-ferrous alloy, and a ferrous-nickel alloy.

2. The cleaning composition of claim 1, wherein based on 100 wt % of the cleaning composition for removing the oxide, an amount of the ammonium sulfate is in a range of about 0.1 wt % to about 35 wt %, an amount of the lauryl sulfonate is in an range of about 0.1 wt % to about 15 wt %, and the remainder is water.

3. The cleaning composition of claim 1, wherein based on 100 wt % of the cleaning composition for removing the oxide, the amount of the citric acid is in a range of about 25 wt % to about 35 wt %, an amount of the ammonium sulfate is in a range of about 0.1 wt % to about 20 wt %, an amount of the lauryl sulfonate is in a range of about 0.1 wt % to about 3 wt %, and the remainder is water.

4. A method of cleaning, the method comprising:
   preparing a mask base material comprising an oxide; and
   performing a first cleaning by contacting the cleaning composition of claim 1 with the mask base material.

5. The method of claim 4, wherein the mask base material further comprises at least one metal selected from Fe, Co, Cr, Mn, Ni, Ti, Mo, an SUS alloy, a nickel-chromium alloy, a nickel-cobalt-ferrous alloy, and a ferrous-nickel alloy.

6. The method of claim 4, wherein the oxide naturally formed in response to irradiating the mask base material with a laser.

7. The method of claim 4, wherein the first cleaning comprises contacting the cleaning composition with the mask base material by using a spray method, a spin coating, or a dipping method.

8. The method of claim 4, wherein the first cleaning comprises using a dipping method in the cleaning composition having a temperature range of about 10° C. to about 50° C. for about 60 minutes to about 1440 minutes.

9. The method of claim 4, further comprising at least one of, after the first cleaning is complete,
   performing a second cleaning by using a cleaning mixture comprising a first alcohol, a surfactant, and water;
   performing a third cleaning by using distilled water; and
   performing a fourth cleaning by using a second alcohol.

10. The method of claim 9, wherein the second cleaning, third cleaning, and fourth cleaning are performed consecutively after the first cleaning is complete.

11. The method of claim 9, wherein the second cleaning comprises using a dipping method in the cleaning mixture having a temperature range of about 10° C. to about 50° C. for about 60 minutes to about 120 minutes.

12. The method of claim 9, wherein the surfactant in the cleaning mixture used in the second cleaning comprises
   at least one surfactant selected from an anionic surfactant comprising at least one of an alkyl phosphate, an alkyl ether phosphate, an alkyl carbonate, and an alkyl ether carbonate; and
   a nonionic surfactant comprising at least one of a polyoxyethylene alkyl ether, a polyoxyethylene fatty acid ester, a polyoxyethylene alkyl phenol ether, a sorbitan fatty acid ester, a polyoxyethylene sorbitan fatty acid ester, and a sucrose fatty acid ester, and
   the first alcohol and the second alcohol each independently comprise at least one alcohol selected from methanol, ethanol, pentanol, 2-methyl-2-butanol, 3-methyl-2-butanol, n-propanol, iso-propanol, butanol, iso-butyl alcohol, 2-butanol, 2-methyl-2-propanol, hexanol, cyclohexanol, benzyl alcohol, propyl alcohol, ethylene glycol, propylene glycol, diethylene glycol, glycerine, and dipropylene glycol.

13. The cleaning composition of claim 1, wherein based on 100 wt % of the cleaning composition for removing the oxide, the amount of the citric acid is in a range of about 25 wt % to about 50 wt %.

* * * * *